US012581935B2

(12) United States Patent
Lai et al.

(10) Patent No.: US 12,581,935 B2
(45) Date of Patent: Mar. 17, 2026

(54) STACKED VIA STRUCTURES AND METHODS FOR FORMING THE SAME

(71) Applicant: Taiwan Semiconductor Manufacturing Company, Ltd., Hsin-Chu (TW)

(72) Inventors: Yen-Kun Lai, New Taipei City (TW); Wei-Hsiang Tu, Hsinchu City (TW); Ching-Ho Cheng, Hsinchu City (TW); Cheng-Nan Lin, Hsinchu City (TW); Chiang-Jui Chu, Yilan County (TW); Chien Hao Hsu, Hsinchu County (TW); Kuo-Chin Chang, Chiayi City (TW); Mirng-Ji Lii, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 416 days.

(21) Appl. No.: 18/173,547

(22) Filed: Feb. 23, 2023

(65) Prior Publication Data

US 2024/0145379 A1     May 2, 2024

Related U.S. Application Data

(60) Provisional application No. 63/381,409, filed on Oct. 28, 2022.

(51) Int. Cl.
| | |
|---|---|
| *H01L 23/48* | (2006.01) |
| *H01L 23/498* | (2006.01) |
| *H01L 23/52* | (2006.01) |
| *H01L 23/522* | (2006.01) |
| *H01L 23/528* | (2006.01) |
| *H01L 25/065* | (2023.01) |

(52) U.S. Cl.
CPC .... *H01L 23/5226* (2013.01); *H01L 23/49816* (2013.01); *H01L 23/528* (2013.01); *H01L 25/0657* (2013.01); *H01L 2225/06544* (2013.01)

(58) Field of Classification Search
CPC ........... H01L 23/5226; H01L 23/49816; H01L 23/528; H01L 25/0657; H01L 2225/06544; H01L 2224/0401
USPC ......................................................... 257/774
See application file for complete search history.

(56) References Cited

U.S. PATENT DOCUMENTS

| | | | |
|---|---|---|---|
| 2020/0126923 A1* | 4/2020 | Hu | ........................... H01L 24/20 |
| 2021/0272889 A1* | 9/2021 | Wu | .................... H01L 23/49833 |
| 2022/0375877 A1 | 11/2022 | Tai et al. | |

* cited by examiner

*Primary Examiner* — Theresa T Doan
(74) *Attorney, Agent, or Firm* — Haynes and Boone, LLP

(57) ABSTRACT

Methods and semiconductor devices are provided. A method includes determining a location of a polyimide opening (PIO) corresponding to an under-bump metallization (UBM) feature in a die. The die includes a substrate and an interconnect structure over the substrate. The method also includes determining a location of a stacked via structure in the interconnect structure based on the location of the PIO. The method further includes forming, in the interconnect structure, the stacked via structure comprising at most three stacked contact vias at the location of the PIO.

20 Claims, 11 Drawing Sheets

STACKED VIA STRUCTURES AND METHODS FOR FORMING THE SAME

CROSS REFERENCE(S)

The instant application is a nonprovisional of and claim priority under 35 U.S.C. 119 to U.S. provisional application No. 63/381,409, filed on Oct. 28, 2022, which is hereby expressly incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In semiconductor industry, an IC chip may be bonded to a package substrate before the package substrate is bonded to a printed circuit board (PCB). The IC chip is often bonded to the package substrate through under-bump metallization (UBM feature) features and solder features, which can be located at various locations of a die. A stacked via structure, including a plurality of contact vias vertically aligned with one another, is often formed in the IC chip to electrically connect a UBM feature and a certain part of the IC chip. A stacked via structure under the UBM feature may experience undesirably high stress. For example, a stacked via structure under the UBM feature is often found to delaminate or crack, failing a reliability test. The reasons for the delamination or cracking can include high tensile stress in the stacked via structure during thermal cycling, especially at high temperature. In other words, the existing configuration of the stacked via structures can impair the reliability of the IC chip.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
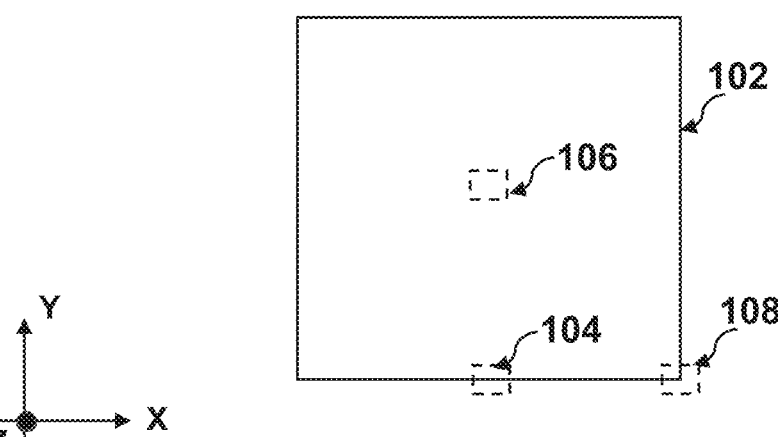
FIG. 1A illustrates various locations of UBM features, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In some device packaging technologies, a semiconductor chip (or IC chip) is bonded to a package substrate to form a semiconductor device package. The semiconductor device package is then bonded to a printed circuit board (PCB). The semiconductor chip is often bonded to the semiconductor device package through a plurality of connecting structures, each of which can include a UBM feature and a solder feature. The semiconductor chip often includes a plurality of dielectric layers stacked together, and an interconnect structure is formed in the dielectric layers. The dielectric layers often include extreme-low k (ELK) materials. The interconnect structure provides electrical connection between the UBM features (e.g., the PCB) and various parts of the semiconductor chip. The interconnect structure can include a plurality of stacked via structures, distributed in the dielectric layers. A stacked via structure often includes a plurality of vertically-aligned contact vias that may or may not be electrically coupled to one another.

A semiconductor chip may undergo a reliability test. The reliability test can include a thermal cycling, in which the semiconductor chip is repetitively cycled from low temperature to high temperature to test the resilience of the semiconductor chip to thermal expansion differences or other structural weakness. A stacked via structure, when formed under a UBM feature, may experience high tensile stress, e.g., pull force, during thermal cycling, especially at high temperature. The stress can be a result of various material and/or structural reasons, such as the difference in thermal expansion coefficients between the stacked via structure and the ELK materials in the dielectric layers, and/or pressure from the UBM feature. A stacked via structure under a UBM feature may be susceptible to delamination or cracking, and the reliability of the semiconductor chip may be impaired.

Figure 1B:
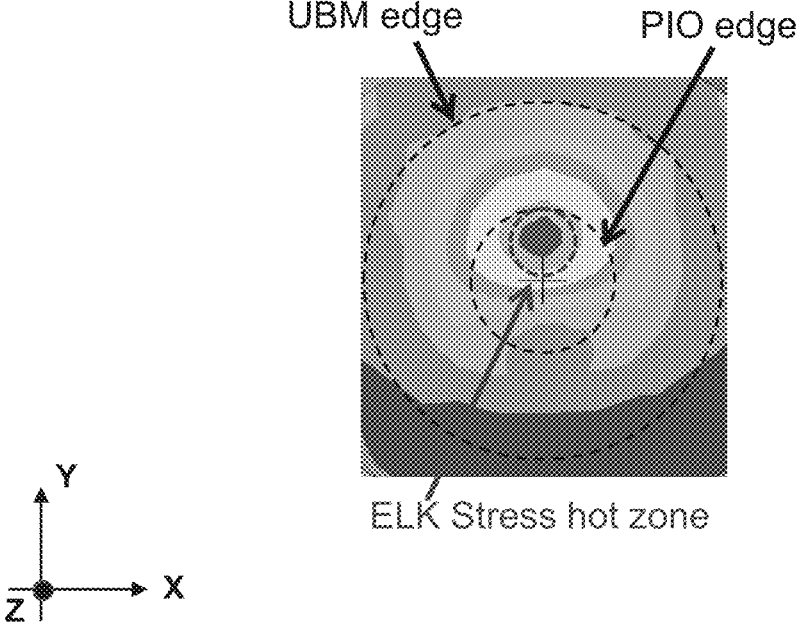
FIGS. 1B-1D each illustrates a simulated stress profile in an interconnect structure at a respective location of a semiconductor device, according to various aspects of the present disclosure.
Figure 1C:
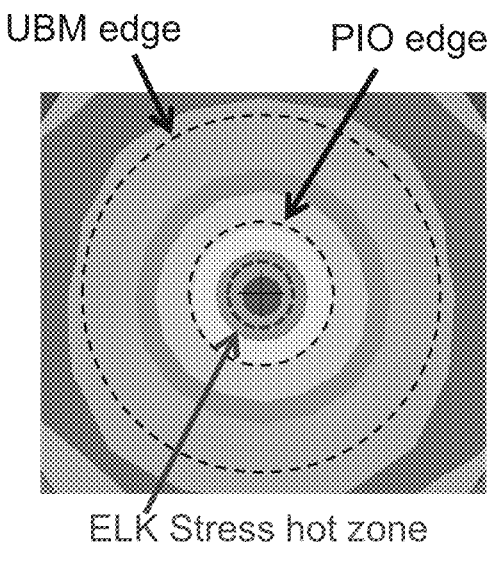
Figure 1C:
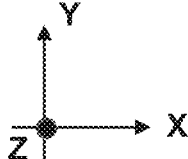
Figure 1D:
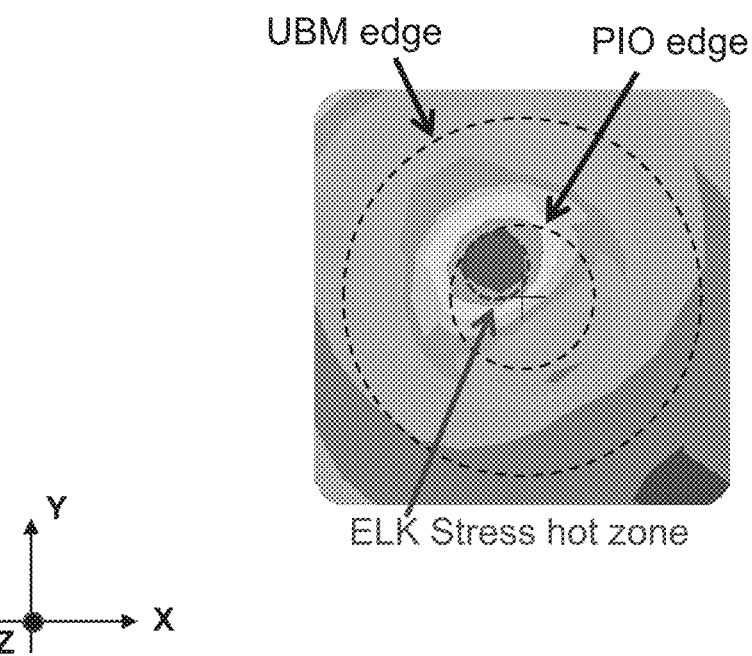

FIG. 1A illustrates various locations of UBM features on a semiconductor chip, and FIGS. 1B-1D each illustrates a simulated stress profile in an interconnect structure under a UBM feature at a respective location. Specifically, FIGS. 1B-1D may show the stress distribution in the respective interconnect structures during thermal cycling, e.g., based on the material properties and/or structure of the semiconductor chip. For ease of illustration, the stress profiles are shown on a lateral plane (e.g., the x-y plane). As shown in FIG. 1A, UBM feature 104 may represent a UBM feature at an edge of a semiconductor chip 102, UBM feature 106 may represent a UBM feature at the center (e.g., geographic center) of semiconductor chip 102, and UBM feature 108 may represent a UBM feature at a corner of semiconductor chip 102. For ease of illustration, when a UBM feature is not located substantially at the center of semiconductor chip 102, the UBM feature may be referred to as being located at an edge or at a corner, e.g., being a peripheral UBM feature. Accordingly, UBM feature 106 may be referred to as a center UBM feature, and UBM features 104 and UBM feature 108 may each be referred to as a peripheral UBM feature.

Referring to FIGS. 1B-1D, different shades show the stress scale in the interconnect structure of semiconductor chip 102. A "UBM edge," shown as the largest dotted circle, represents the boundary of a UBM feature (e.g., the projection of the UBM feature) in the x-y plane. In some embodiments, when a UBM feature is located at a corner of semiconductor chip 102, the UBM feature may be located on a diagonal line of semiconductor chip 102. A "PIO edge," shown as the second largest dotted circle, represents the boundary of a polyimide opening (e.g., the projection of the polyimide opening) under the UBM feature in the x-y plane. "ELK stress hot zone," shown as the smallest dotted circle, represents an area in the interconnect structure that undergoes the highest stress during thermal cycling. The boundary of "ELK stress hot zone" may be defined by the software based on the stress distribution in the interconnect structure. For example, in "ELK stress hot zone," the stress may be equal to or higher than a threshold value. The above simulated stress distributions may be employed to determine/calculate the stress in the interconnect structure under UBM features of different locations.

FIG. 1B illustrates a stress profile in the interconnect structure under UBM feature 104, e.g., a peripheral UBM feature. As shown in FIG. 1B, "ELK stress hot zone" may be located substantially towards the geographic center of semiconductor chip 102. In some embodiments, the center of "ELK stress hot zone" may be along a line through the geographic center of semiconductor chip 102 and the center of "PIO edge" at an edge of semiconductor chip 102. FIG. 1C illustrates a stress profile in the interconnect structure under UBM feature 106, a center UBM feature. As shown in FIG. 1C, "ELK stress hot zone" may be substantially concentric with the semiconductor chip 102. FIG. 1D illustrates a stress profile in the interconnect structure under UBM feature 108, e.g., a peripheral UBM feature. As shown in FIG. 1D, "ELK stress hot zone" may be located along a line through the geographic center of semiconductor chip 102 and the center of "PIO edge" at a corner of semiconductor chip 102. In the examples shown in FIGS. 1B-1D, the highest stress may be substantially within the respective "ELK stress hot zone." In some embodiments, "ELK stress hot zone" may be defined to be completely within "PIO edge." In the thermal cycling, stacked via structures located in an "ELK stress hot zone" may undergo undesirably high stress and may be susceptible to delamination/cracking.

The present disclosure provides a semiconductor device and methods for forming the semiconductor device. The semiconductor device (or semiconductor chip) includes an interconnect structure that includes one or more stacked via structures. According to embodiments of present disclosure, the stacked via structures of the present disclosure have adjusted locations and/or structures, compared to existing stacked via structures, such that the stacked via structures are under less pull force during the thermal cycling. The stacked via structures are less susceptible to delamination/cracking. Prior to forming the stacked via structures, a stress profile of the interconnect structure under a UBM feature is simulated and analyzed. The locations and/or structures of the stacked via structures can then be determined based on the stress profile. Other approaches to reduce the stress under the UBM features, such as increasing a dimension of a polyimide opening (PIO) and increasing a density of the UBM features in the semiconductor device, are also disclosed in the present disclosure.

In some embodiments, a keep-out-zone (KOZ) is determined in the interconnect structure of the semiconductor device, and stacked via structures are formed outside the KOZ. The KOZ, under a UBM feature, is an area that covers the high-stress area (e.g., the determined "ELK stress hot zone") in the interconnect structure, and no stacked via structures, having more than three stacked contact vias, is formed in the KOZ. The size and location of a KOZ can be determined based on the location of the UBM feature (e.g., the center of the PIO) and the size of the PIO. For example, if the UBM feature is substantially at the center of the semiconductor device (e.g., being a center UBM feature), the KOZ may be substantially located at the geographic center of the semiconductor device, and the center of the KOZ may laterally overlap with the center of the PIO. If the UBM feature is located off the center of the semiconductor device (e.g., being a peripheral UBM feature), e.g., at the edge or a corner of the semiconductor device, the center of the KOZ may be substantially on a centripetal line connecting the geographic center of the die and the center of the PIO. Because the KOZ is determined and stacked via structures are formed outside the KOZ (e.g., outside the determined "ELK stress hot zone"), a desirable number of stacked contact vias can be formed in a stacked via structure outside the KOZ. For example, the number of stacked contact vias in such as stacked via structure may be more than 3. In some embodiments, the number of contact vias in the stacked via structure is at least two, e.g., 2, 3, 4, 5, etc.

In some embodiments, when a stacked via structure has a reduced number of contact vias compared to existing stacked via structures, a KOZ may or may not be determined. In these embodiments, the stacked via structure, formed under a UBM feature/PIO, can include at most three contact vias vertically aligned with one another. In an example, the stacked via structure shifts away from the top contact via in the interconnect structure by a lateral distance, and the number of contact vias in the stacked contact structure may be less than or equal to three. In another example, the stacked via structure is vertically aligned with the top contact via in the dielectric layers, and the number of contact vias in the stacked contact structure may be less than or equal to two.

It should be noted that, although not shown, in various embodiments, different approaches of the present disclosure can be combined, when possible, to further reduce the stress in the semiconductor device under the UBM feature. For example, a KOZ may be determined, and a stacked via structure having a maximum number of three contact vias stacked together may be disposed outside the KOZ. The approaches may be employed separately or in any combination, depending on at least partially based on the stress determined in the interconnect structure, and the design and fabrication of the semiconductor device. The scope of the present disclosure should not be limited by the embodiments of the present disclosure.

Figure 2A:
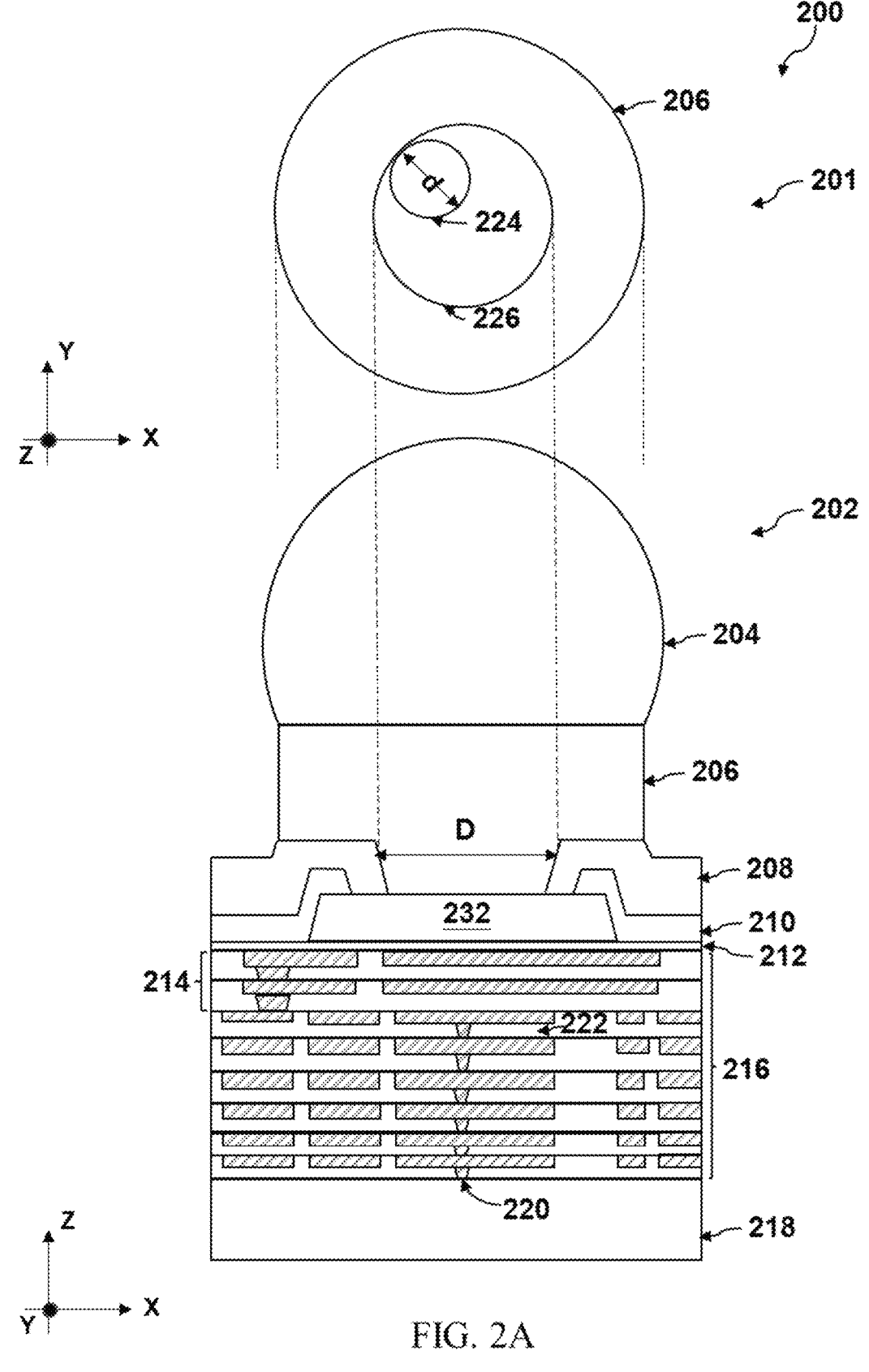
FIG. 2A illustrates a top view and a cross-sectional view of a semiconductor device, according to various aspects of the present disclosure.

FIG. 2A illustrates a top view and a cross-sectional view of a semiconductor device 200, according to various aspects of the present disclosure. Specifically, view 201 is a top view of semiconductor device 200, and view 202 is a cross-sectional view of semiconductor device 200. Semiconductor device 200 may be part of an IC chip (or a semiconductor chip), which can be bonded to a package substrate. The bonded IC chip and package substrate can form a semiconductor device package. Semiconductor device 200 may include a die, in which one or more UBM features are located. FIG. 2A shows the example of a single UBM feature for illustrative purposes.

Semiconductor device 200 may include a semiconductor substrate 218, an interconnect structure 216 over semiconductor substrate 218, a passivation layer 212 over interconnect structure 216, a contact pad 232 over passivation layer 212 and electrically coupled to interconnect structure 216, a passivation layers 210 over contact pad 232, a PI layer 208 over passivation layer 210, an under-bump metallization (UBM feature) feature 206 over PI layer and electrically coupled to contact pad 232, and a solder feature 204 over UBM feature 206. In some embodiments, interconnect structure 216 includes one or more top interconnect layers 214.

Semiconductor substrate 218 may include crystalline silicon, crystalline germanium, crystalline silicon germanium, and/or a III-V compound semiconductor such as GaAsP, AlInAs, AlGaAs, GaInAs, GaInP, GaInAsP, or the like. While not explicitly shown in FIG. 2A, semiconductor substrate 218 may include front-end-of-line (FEOL) semiconductor features, such as transistors, and MEOL contact features, such as gate contact vias, source/drain contact, source/drain contact vias. Interconnect structure 216 may include about 10 and about 15 metallization layers, such as about 13 metallization layers, although only 6-8 metallization layers are shown for illustrative purposes. The metallization layers of interconnect structure 216 are embedded in a plurality of intermetal dielectric (IMD) layers that may be formed of low-k (LK) or extreme low-k (ELK) dielectric materials. Low-k dielectric materials refer to dielectric materials with a dielectric constant smaller than that of silicon dioxide, which is about 3.9. Example low-k dielectric materials may include Phosphosilicate Glass (PSG), Borosilicate Glass (BSG), Boron-Doped Phosphosilicate Glass (BPSG), Fluorine-Doped Silicate Glass (FSG), Tetraethyl orthosilicate (TEOS). ELK dielectric materials refer to dielectric materials with a dielectric constant smaller than 2.7. Example ELK dielectric materials include porous organosilicate glass. The metallization layers may include copper (Cu) or titanium nitride (TiN). In some embodiments, interconnect structure 216 includes one or more top interconnect layers 214, which can include one or more metallization layers in a plurality of IMD layers. The metallization layers of top interconnect layers 214 may be of different material or thickness than those below. For example, the metallization layers of top interconnect layers 214 may be thicker and/or include a different material. An example of the metallization layers of top interconnect layers 214 may include aluminum copper, etc.

Contact pad 232 may include of aluminum (Al) or aluminum copper (Al—Cu) and may be referred to as an aluminum pad. Passivation layers 210 and 212 may each include a multilayer that includes one or more polyimide layers, one or more silicon nitride layer, one or more silicon oxide layers, or a combination of both. PI layer 208 may include one or more polyimide layers. PI layer 208 may include an opening (e.g., PI opening or PIO) 226 through which UBM feature is in contact with contact pad 232. UBM feature 206 may include multiple layers, such as a barrier layer, a seed layer and a metal bump. In some embodiments, UBM feature 206 may include titanium, titanium nitride, nickel, cupronickel, cobalt, copper, or a combination thereof. Solder feature 204 may also be referred to as a solder bump. In some embodiments, solder feature 204 may include Pb—Sn, InSb, tin, silver, copper, or a combination thereof. UBM feature 206 and solder feature 204 may be collectively referred to as a connecting structure. The connecting structure comes into contact with a package substrate by way of a pre-solder feature that includes alloys of tin, lead, silver, copper, nickel, bismuth, or combinations thereof.

Interconnect structure 216 may include one or more stacked via structures 222, e.g., vertically extending in IMD layers. Stacked via structures 222 outside a KOZ 224 (e.g., a high-stress area) may include at least two contact vias 220 vertically aligned with one another in the z-direction. In some embodiments, stacked via structure 222 outside KOZ

224 may be located in a low-stress area (or an area of lower stress compared to KOZ 224) and include more than three contact vias 220 vertically aligned with one another. Contact vias 220 may or may not be electrically coupled to one another. Contact vias 220 may include a suitable conductive material such as copper (Cu) or titanium nitride (TiN). Contact vias 220 in stacked via structure 222 may provide electrically connection amongst components electrically couple to interconnect structure 216. Each of the at least two contact vias 220 may be disposed in a respective IMD layer. In some embodiments, semiconductor device 200 includes hundreds of thousands of stacked via structures 222. In some embodiments, the number of contact vias 220 in stacked via structure 222 may be at least 3, e.g., 3, 4, 5, etc.

As described earlier, thermal cycling may be introduced in a reliability test, and interconnect structure 216 under UBM feature 206 may undergo high stress, causing delamination in interconnect structure 216. For example, stacked via structures 222 may be susceptible to cracking or delamination. The present disclosure provides semiconductor device 200 that has a keep-out zone (KOZ) 224 in which no stacked via structures 222 is formed. In the x-y plane, KOZ 224 (or the projection of KOZ 224) may be completely within the area defined/covered by PIO 226 (or the projection of PIO 226). In various embodiments, the location of KOZ 224, in the area defined by PIO 226, may be predetermined before the formation of KOZ 224 based on the location of the respective UBM feature 206. Referring back to FIGS. 1A-1D and the related description, by forming the stacked via structures 222 outside KOZ 224, stacked via structures 222 may be subject to less stress during thermal cycling, and may be less susceptible to cracking or delamination. For illustrative purposes, UBM feature 206 in FIG. 2A is a peripheral UBM feature, and the center of KOZ 224 may be substantially on a line through the center of PIO 226 and the geographic center of the die.

KOZ 224 include any suitable shape that covers the lateral area in interconnect structure 216 that has a stress equal to or higher than a threshold stress value. For example, KOZ 224 may have a circular shape, an oval shape, a squared shape, a rectangular shape, a polygonal shape, and/or an arbitrary shape. For ease of illustration, KOZ 224 in embodiments of the present disclosure has a circular shape. The dimensions of KOZ 224 may be at least partially determined based on the dimensions of PIO 226. In some embodiments, KOZ 224 is determined to be covering (e.g., the same as or slightly greater than) "ELK stress hot zone," referring back to FIGS. 1B-1C. In some embodiments, a ratio of a diameter of KOZ 224 to a diameter of PIO 226 is between about 0.4 to about 0.6. For example, the ratio may be equal to or greater than 0.4 and equal to or less than 0.6. In other words, when KOZ 224 and PIO 226 are concentric, KOZ 224 may claim a center region of PIO 226, leaving only an outer rim region of PIO 226 for vertical placement of stacked via structures 222; when KOZ 224 and PIO 226 are not concentric, KOZ 224 may claim a peripheral region of PIO 226, leaving the remaining region of PIO 226 for the vertical placement of stacked via structures 222.

Figure 2B:
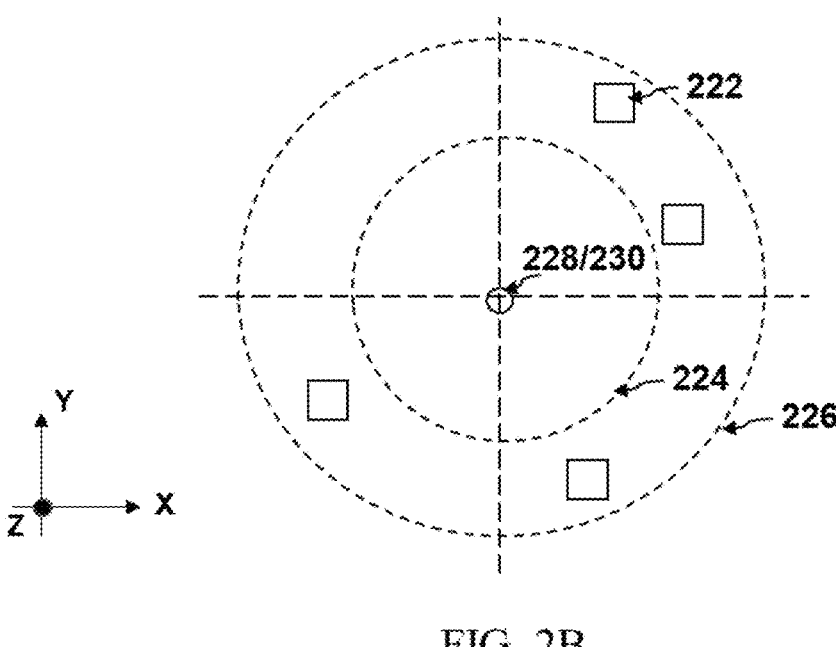
FIG. 2B illustrates a top view of a keep-out-zone (KOZ), according to various aspects of the present disclosure.

FIG. 2B illustrates a top view of semiconductor device 200 showing KOZ 224, PIO 226, and stacked via structures 222, when UBM feature 206 is a center UBM feature (e.g., UBM feature 106), according to embodiments of the present disclosure. In the x-y plane, when UBM feature 206 is located substantially at a geographic center of semiconductor device 200, and PIO 226 may be located substantially at a geographic center of semiconductor device 200. A PIO center 228 (i.e., the center of PIO 226) and a KOZ center 230

(i.e., the center of KOZ 224) may substantially overlap at the geographic center of semiconductor device 200. That is, PIO center 228, KOZ center 230, and the geographic center of semiconductor device 200 may be substantially concentric with one another along the z-direction. In the x-y plane, KOZ 224 (or the projection of KOZ 224) may be completely within the area defined by PIO 226 (or the projection of PIO 226). In the x-y plane, one or more stacked via structures 222 may be disposed in the area outside KOZ 224 but nevertheless inside the area defined by PIO 226. In some embodiments, a ratio of a distance between KOZ center 230 to PIO center 228 to the diameter of PIO 226 (i.e., D) is in a range from about 0 to about 0.15. For example, the ratio may be equal to or greater than 0 and equal to or less than 0.15.

Figure 2C:
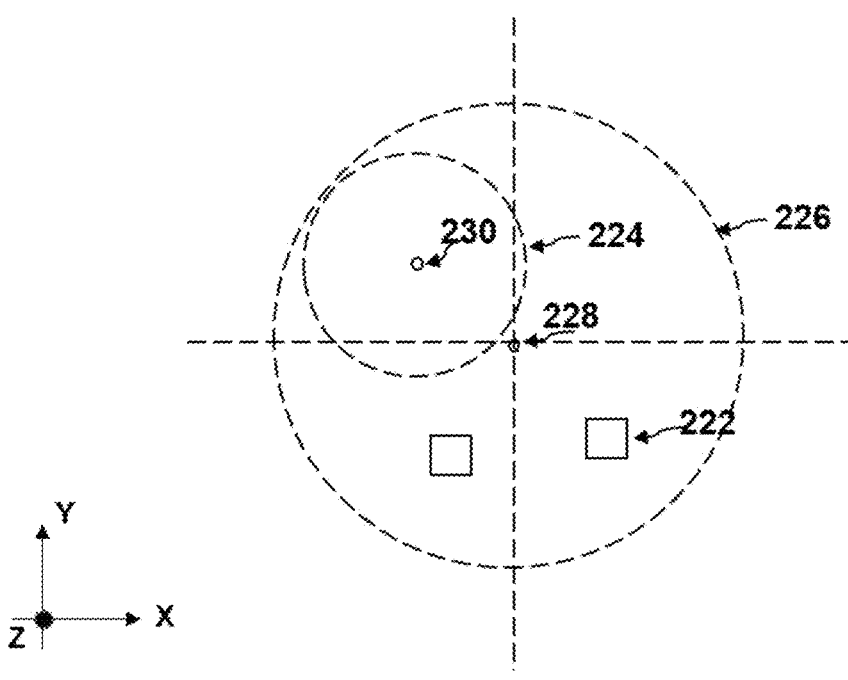
FIG. 2C illustrates a top view of another KOZ, according to various aspects of the present disclosure

FIG. 2C illustrates a top view of semiconductor device 200 showing KOZ 224, PIO 226, and stacked via structures 222 when UBM feature 206 is a peripheral UBM feature (e.g., UBM features 104 and 108), according to some embodiments of the present disclosure. In the x-y plane, when UBM feature 206 is located substantially at an edge/corner of semiconductor device 200, a PIO center 228 (i.e., the center of PIO 226) and a KOZ center 230 (i.e., the center of KOZ 230) may be separated from each other. In some embodiments, PIO center 228, KOZ center 230, and the geographic center of semiconductor device 200 may be on the same line. For example, KOZ center 230 may be located between PIO center 228 and the geographic center of semiconductor device 200, and may be on the line through PIO center 228 and the geographic center of the die. In the x-y plane, KOZ 224 (or the projection of KOZ 224) may be completely within the area defined by PIO 226 (or the projection of PIO 226). One or more stacked via structures 222 may be disposed in the area outside KOZ 224 but inside the area defined by PIO 226, in the x-y plane. In some embodiments, a ratio of a distance between KOZ center 230 to PIO center 228 to the diameter of PIO 226 (i.e., D) is equal to or greater than 0.15.

Figure 2D:
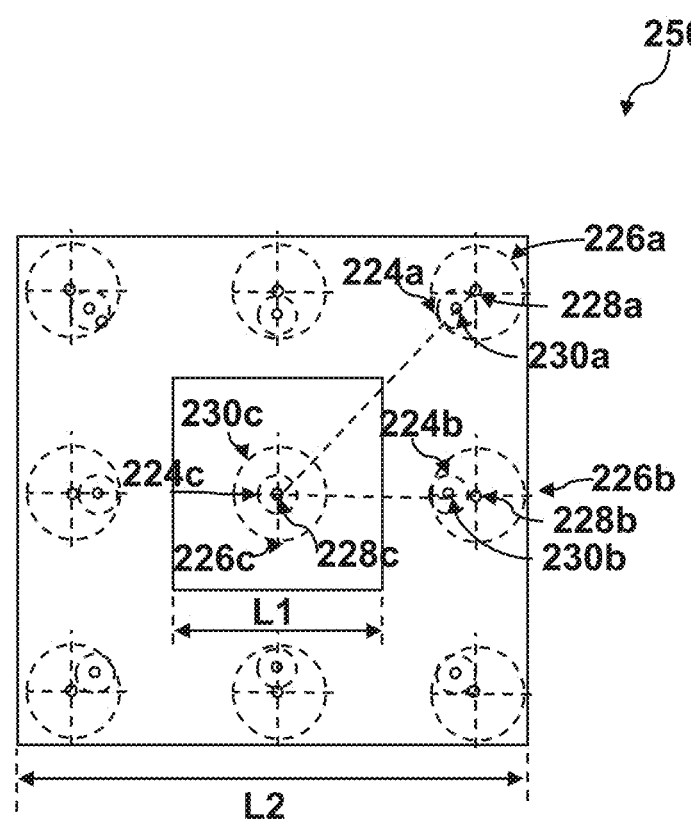
FIG. 2D illustrates a top view of a die and a plurality of KOZ's in the die, according to various aspects of the present disclosure.
Figure 2D:
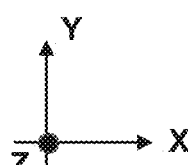

FIG. 2D illustrates semiconductor device 200 having a center UBM feature and a plurality of peripheral UBM features, according to embodiments of the present disclosure. Semiconductor device 200 may include a die 250, in which semiconductor substrate 218, interconnect structure 216, and other structures shown in FIG. 2A are formed. The center UBM feature and the plurality of peripheral UBM features are formed over interconnect structure 216. For ease of illustration, the PIOs and KOZs are enlarged, and the components in FIG. 2A are not meant to scale. As shown in FIG. 2D, die 250 may include a plurality of peripheral UBM features located on edges and corners of semiconductor device 200. For example, a PIO 226a is under a corner UBM feature, and a KOZ 224a is located completely in the area defined by PIO 226a. KOZ center 230a is located on a line through PIO center 228a and the geographic center of die 250. A PIO 226b is under an edge UBM feature, and a KOZ 224b is located completely in the area defined by PIO 226b. KOZ center 230b is located on a line through PIO center 228b and the geographic center of die 250. A PIO 226c is under a center UBM feature, and a KOZ 224c is located completely in the area defined by PIO 226c. KOZ center 230c is substantially overlapped with PIO center 228a.

In some embodiments, die 250 may be divided into a core region and a non-core region. The core region is represented by the central rectangular area, and the non-core region is represented by the rest of the area of die 250. In the core region, KOZ's 224 may each be substantially close to the geographic center of the projection of the respective UBM features (as referring back to FIG. 2B). In non-core/periph-eral region, KOZ's may each be close to the edges of the respective UBM features (as referring back to FIG. 2C). In some embodiments, the core region has a dimension L1 along the x-direction and/or the y-direction, and die 250 has a dimension L2 along the same direction. In some embodi-ments, a ratio of L1 to L2 is less than or equal to 0.5. By dividing die 250 into a core region and a non-core region, it can be easier to check for high stress in stacked via struc-tures in die 250, especially in the non-core region. The locations of stacked via structures can be more accurately determined in the non-core region.

Figure 3A:
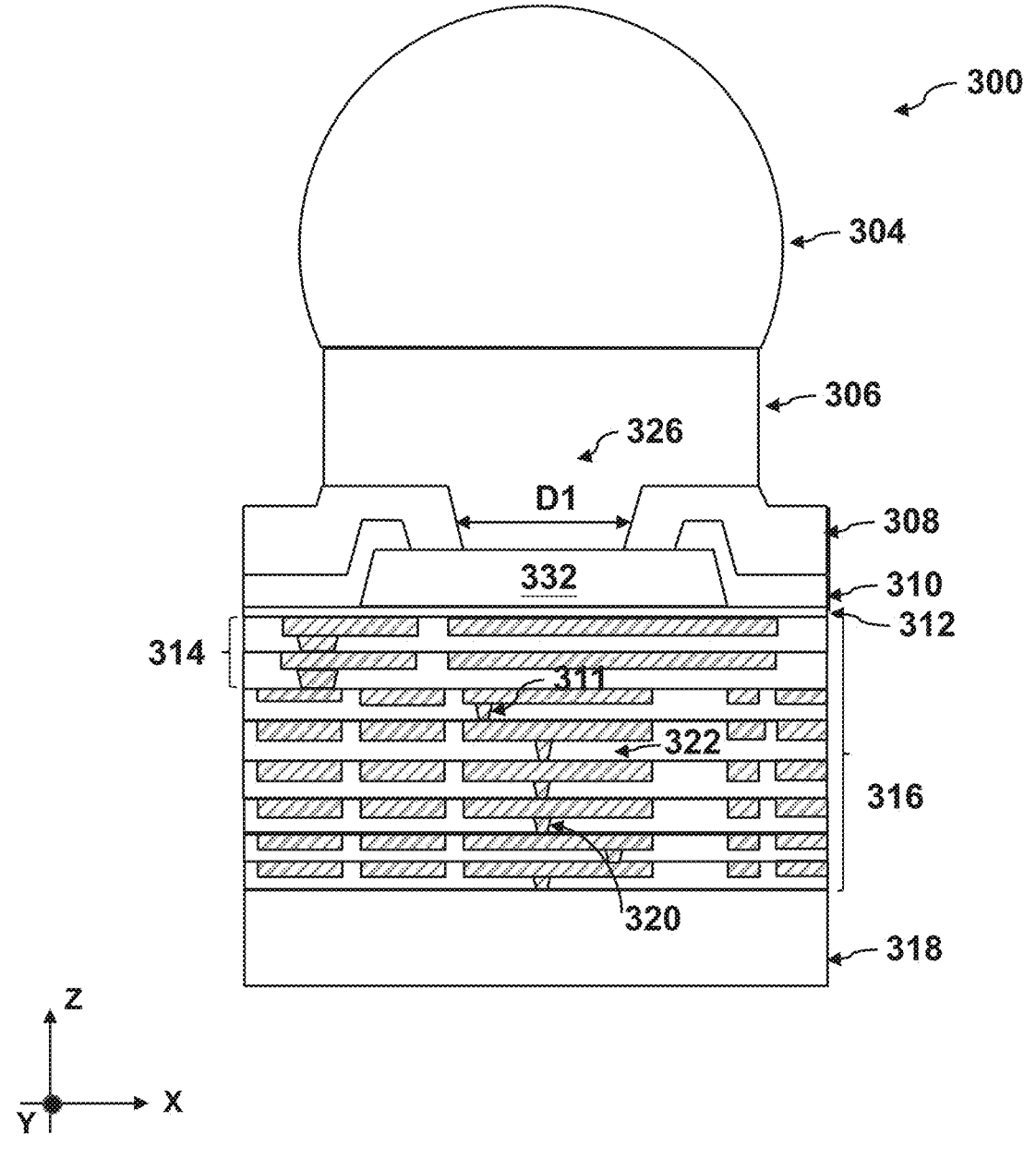
FIG. 3A illustrates a cross-sectional view of another semiconductor device, according to various aspects of the present disclosure.

FIG. 3A illustrates a cross-sectional view of a semicon-ductor device 300, according to embodiments of the present disclosure. The stress in the interconnect structure may be reduced in semiconductor device 300. Similar to semicon-ductor device 200, semiconductor device 300 may include a semiconductor substrate 318, an interconnect structure 316 over semiconductor substrate 318, a passivation layer 312 over interconnect structure 316, a contact pad 332 over passivation layer 312 and electrically coupled to intercon-nect structure 316, a passivation layers 310 over contact pad 332, a PI layer 308 over passivation layer 310, a UBM feature 306 over PI layer and electrically coupled to contact pad 332, and a solder feature 304 over UBM feature 306. In some embodiments, interconnect structure 316 includes one or more top interconnect layers 314. PI layer 308 may form a PIO 326 over contact pad 332. The detailed description of some components of semiconductor device 300 may be referred to that of semiconductor device 200, and is not repeated herein.

Different from semiconductor device 200, interconnect structure 316 may include a stacked via structure 322 in the high-stress area under UBM feature 306/PIO 326. In some embodiments, stacked via structure 322 (or the projection of stacked via structure 322) may be in any suitable location in the area defined by PIO 326 (or the projection of PIO 326). In general, stacked via structures in a high-stress area (e.g., the "ELK stress hot zone") are more susceptible to defects such as delamination/cracking, while stacked structures in a low-stress area (e.g., outside the "ELK stress hot zone") are less susceptible to these defects. Because no KOZ (e.g., an area covering the "ELK stress hot zone") is determined in interconnect structure 316, stacked via structures 322 in the high-stress area defined/covered by PIO 326 may not have more than three contact vias 320 vertically aligned with one another. That is, the number of contact vias 320 in stacked via structure 322 in the area covered by PIO 326 is at most three to reduce or prevent the defects, such as delamination or cracking, in stacked via structure 322. The at most three contact vias 320 may each be in a respective IMD layer. In some embodiments, top interconnect layers 314 may or may not be formed in interconnect structure 316, and the at most three contact vias 320 may not be vertically aligned with another contact via in an IMD layer immediately above and/or below stacked via structure 322. In some embodi-ments, the stress in interconnect structure 316 can be reduced by at least about 29% if the diameter of the PIO is increased at described above.

Figure 3B:
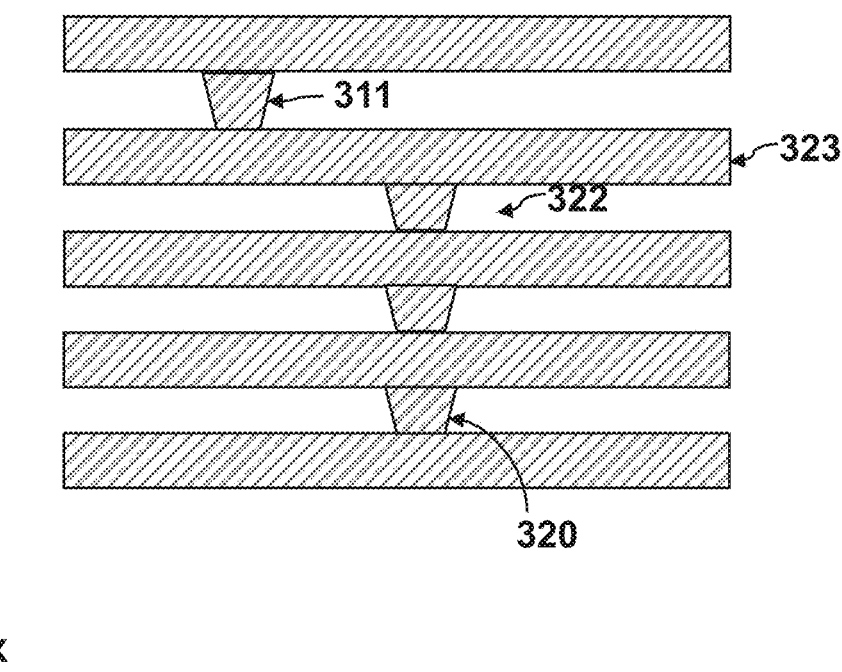
FIG. 3B is an enlarged fragmentary cross-sectional view of an interconnect structure in the semiconductor device, according to various aspects of the present disclosure.
Figure 3C:
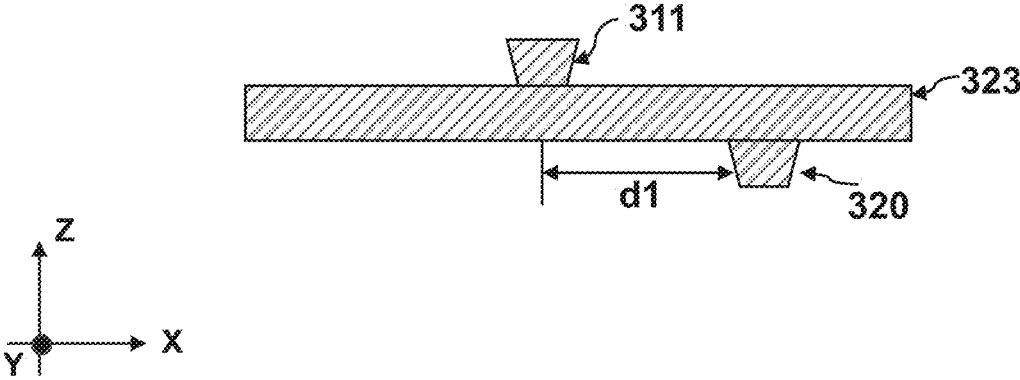
FIG. 3C is an enlarged fragmentary cross-sectional view of the interconnect structure in FIG. 3B, according to various aspects of the present disclosure.

In some embodiments, stacked via structure 322 may be laterally away from another contact via in an IMD layer immediately above and/or below stacked via structure 322 by at least a distance dl. For example, the topmost one of contact vias 320 of stacked via structure 322 may be the second top contact via of interconnect structure 316. The topmost one of contact vias 320 may be laterally separated from the top contact via 311 of interconnect structure 316 by at least dl, as shown in FIGS. 3B and 3C. In some embodi-ments, the value of dl is equal to or greater than about 26.5 nm. In some embodiments, top contact via 311 can sustain higher stress than contact via 320 due to difference in material, structure, design, etc. If dl is less than about 26.5 nm, top contact via 311 can transfer the stress from UBM feature 306 to stacked via structure 322, and an undesirably high stress may be imposed on stacked structure 322 (or contact vias 320). Stacked via structure 322 may be suscep-tible to damage. In some embodiments, the topmost one of conductive vias 320 and the top contact via 311 may be electrically coupled by metal routing 323 in the metalliza-tion layers. It should be noted that, the dl may be a distance between stacked via structure 322 and a contact via in an adjacent IMD along any suitable lateral direction in the x-y plane, depending on the design and fabrication of semicon-ductor device 300. The figures of the present disclosure are not meant to limit the location of the other contact via.

Figure 4A:
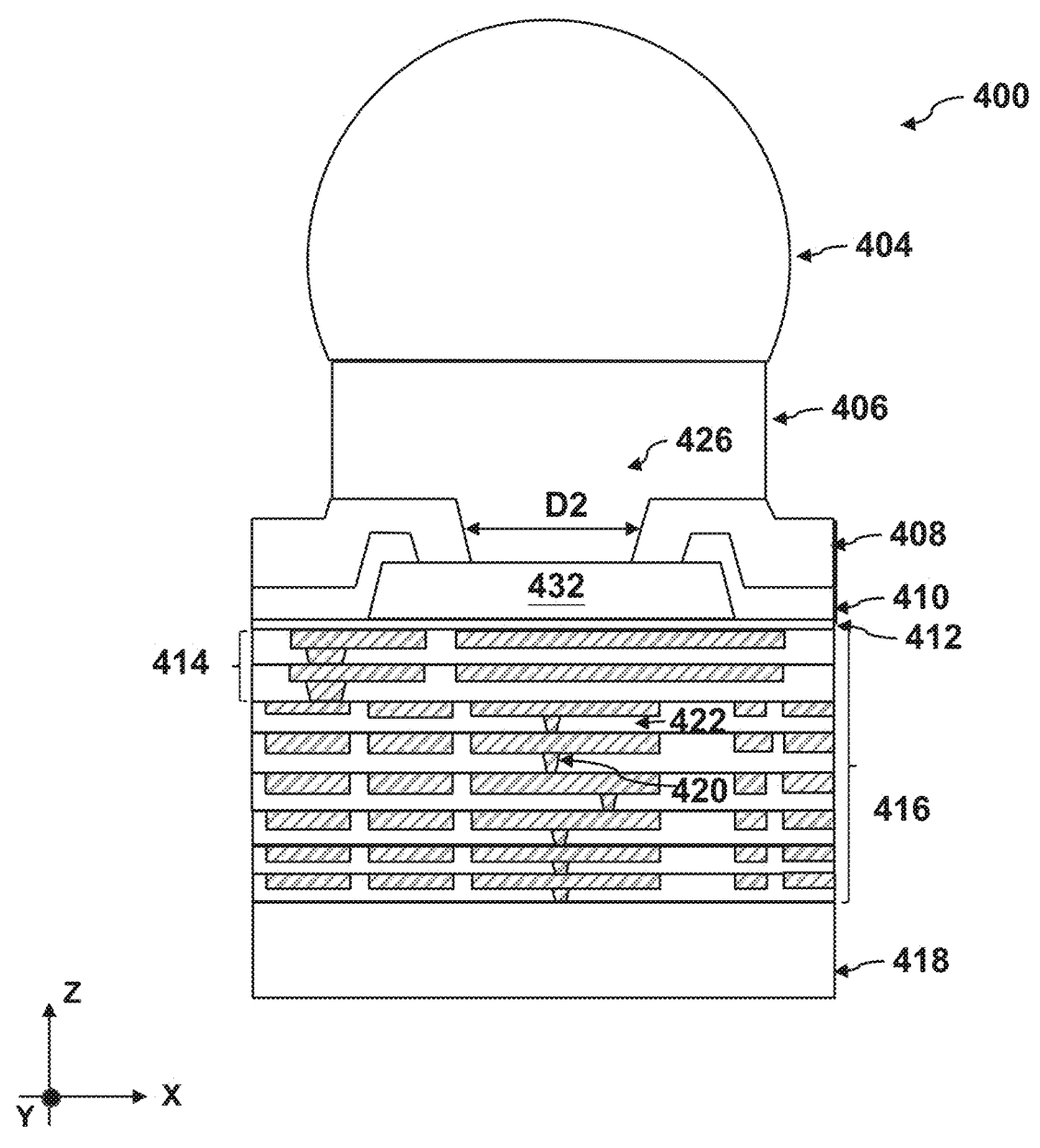
FIG. 4A illustrates a cross-sectional view of another semiconductor device, according to various aspects of the present disclosure.

FIG. 4A illustrates a cross-sectional view of a semicon-ductor device 400, according to embodiments of the present disclosure. The stress in the interconnect structure may be reduced in semiconductor device 400. Similar to semicon-ductor device 200, semiconductor device 400 may include a semiconductor substrate 418, an interconnect structure 416 over semiconductor substrate 418, a passivation layer 412 over interconnect structure 416, a contact pad 432 over passivation layer 412 and electrically coupled to intercon-nect structure 416, a passivation layers 410 over contact pad 432, a PI layer 408 over passivation layer 410, a UBM feature 406 over PI layer and electrically coupled to contact pad 432, and a solder feature 404 over UBM feature 406. In some embodiments, interconnect structure 416 includes one or more top interconnect layers 414. PIO 426 may be disposed in PI layer 408 and over contact pad 432. The detailed description of some components of semiconductor device 400 may be referred to that of semiconductor device 200, and is not repeated herein.

Figure 4B:
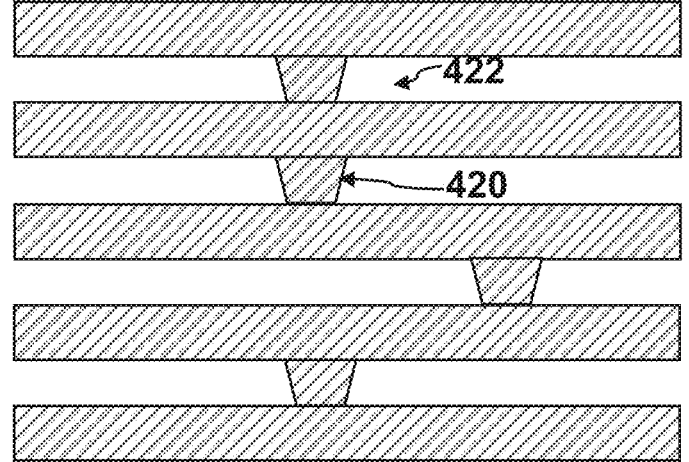
FIG. 4B is an enlarged fragmentary cross-sectional view of an interconnect structure in the semiconductor device, according to various aspects of the present disclosure.
Figure 4B:
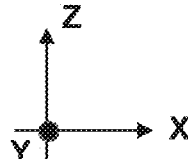

Different from semiconductor device 200, interconnect structure 416 may include a stacked via structure 422 in the high-stress area under UBM feature 406. In some embodi-ments, no KOZ is determined in semiconductor device 400, and stacked via structure 422 (or the projection of stacked via structure 422) may be in any suitable location in the area defined by PIO 426 (or the projection of PIO 426). For example, stacked via structure 422 may be disposed under, e.g., directly under, PIO 426, such that the vertical projection of stacked via structure 422 may be completely within the vertical projection of PIO 426 one the x-y plane. In some embodiments, the vertical projection of stacked via structure 422 may be substantially concentric with the vertical pro-jection of PIO 426. Stacked via structure 422 may include at most two contact vias 420 (e.g., 1, or 2), which are vertically aligned with one another. The at most two contact vias 420 may each be in a respective IMD layer. In some embodi-ments, although not specifically shown, the topmost one of contact vias 420 of stacked via structure 422 may be immediately below a contact via in top interconnect layers 414, and stacked via structure 422 may be vertically aligned with the top contact via. In some embodiments, no top interconnect layers 414 is formed in interconnect structure 416, and the topmost one of contact vias 420 of stacked via structure 422 may be the top contact via in interconnect structure 416. In some embodiments. the at most two contact vias 420 may be laterally separated from another contact via immediately below stacked via structure 422, as shown in FIG. 4B. In some embodiments, the lateral distance between stacked via structure 422 and the contact via immediately below stacked via structure 422 may be equal to at least distance dl, referring to FIG. 3C. In some embodiments, the value of dl is equal to or greater than about 26.5 nm. In some embodiments, the bottommost conductive via 420 and the contact via immediately below stacked via structure 422, if electrically coupled, may be electrically connected by metal routing. It should be noted that, dl may be a distance between stacked via structure 422 and another contact via in an adjacent IMD along any suitable lateral direction in the x-y plane, depending on the design and fabrication of semiconductor device 300. The figures of the present disclosure are not meant to limit the location of the other contact via.

In some embodiments, the diameter of PIO is increased to reduce the stress in the underlying interconnect structure. For example, diameter D1 of PIO 326 in FIG. 3A and diameter D2 of PIO 426 in FIG. 4A may each be increased, e.g., compared to that of an existing PIO, to reduce the stress in interconnect structure 216 and 416. In some embodiments, a ratio of the diameter of PIO (e.g., D1/D2) to a critical dimension of the respective UBM feature (e.g., 306/406) may be equal to or greater than about 0.5. In some embodiments, the stress in the interconnect structure can be reduced by at least about 9% if the diameter of the PIO is increased at described above.

Figure 5:
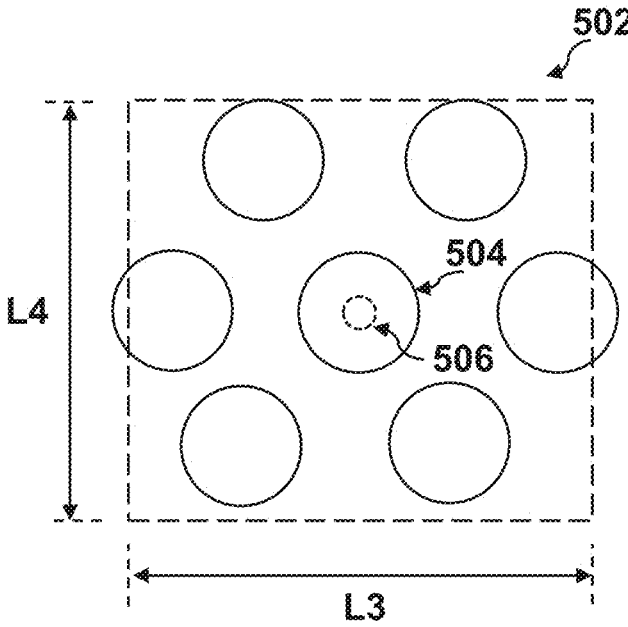
FIG. 5 illustrates a top view of a checking window encompassing a plurality of UBM features, according to various aspects of the present disclosure.
Figure 5:
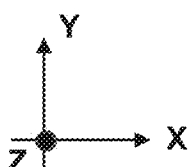

FIG. 5 illustrates a top view of a checking window 502 on a semiconductor device, according to embodiments of the present disclosure. Checking window 502 may be part of semiconductor device 200, 300, or 400. A UBM density may be increased in checking window 502 to decrease stress in the interconnect structure underlying the UBM features in checking window 502. The UBM density may be defined as the ratio of the UBM area (e.g., the area covered by the UBM features in checking window 502) to the area of checking window 502. As shown in FIG. 5, checking window 502 may have a first length of L3 in a lateral direction (e.g., the x-direction), and a second length of L4 in another lateral direction (e.g., the y-direction). Checking window 502 may encompass a plurality of UBM features 504, which are examples of UBM features 206, 306, and 406. Each UBM feature 504 may be over a respective PIO 506, which are examples of PIOs 226, 326, and 426. The UBM density may be equal to the ratio of the total area covered by UBM features 504 to the rectangular area defined by (L3×L4). In some embodiments, the total area covered by UBM features 504 in an area on a semiconductor device (e.g., 200, 300, or 400) may be increased to increase the UBM density, and thus reduce the stress in the underlying interconnect structure. In some embodiments, the UBM density is at least about 13%.

In some embodiments, the aforementioned ways (e.g., illustrated in FIGS. 2A, 3A, and 4A) to reduce the stress in the interconnect structure may be used in any combination, depending on the design and fabrication of the semiconductor device. For example, a semiconductor device may have a plurality of stacked via structures illustrated in FIGS. 3A and/or 4A, and may be formed outside a KOZ. In another example, another semiconductor device may have a plurality of stacked via structures illustrated in FIG. 3A, with a desirably large PIO and a desirably high UBM density. The stress in the interconnect structure in the other semiconductor device may be decreased by about 38%.

Figure 6:
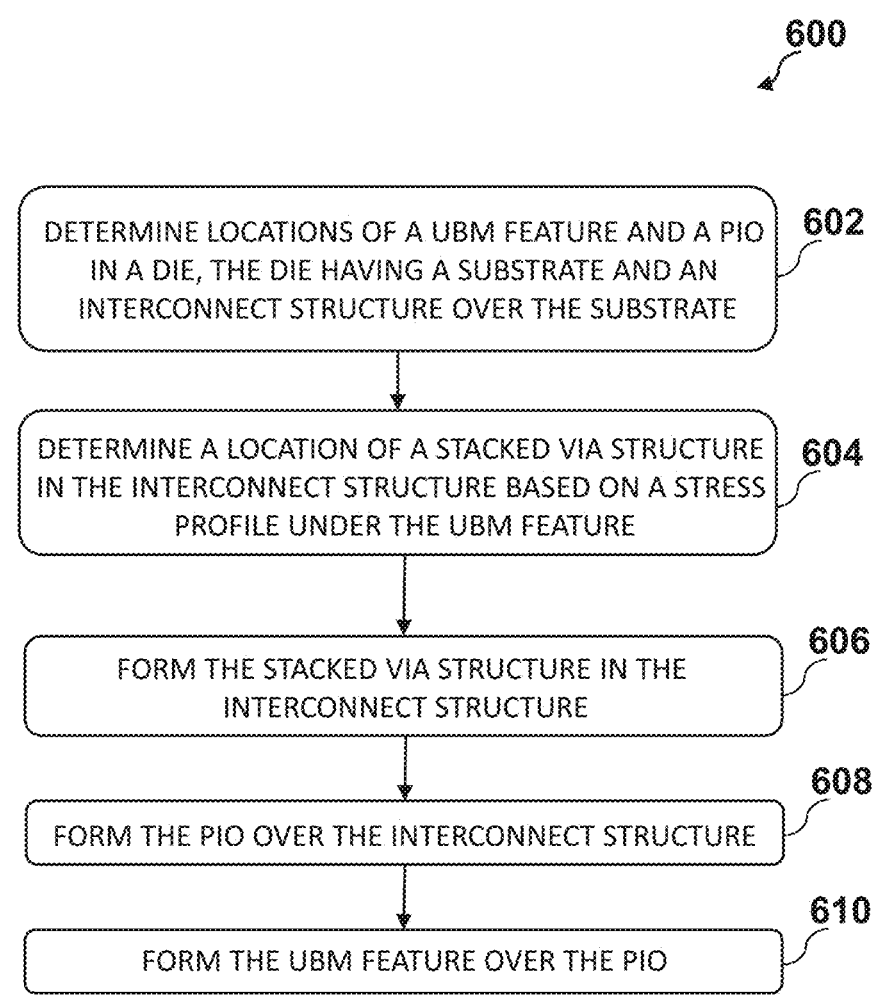
FIG. 6 is a flowchart of a method for forming a semiconductor device having a stacked via structure, according to various aspects of the present disclosure.

A method 600 of forming a semiconductor device is illustrated in the flowchart in FIG. 6. Method 600 is merely an example, and is not intended to limit the present disclosure beyond what is explicitly recited in the claims. Additional operations can be provided before, during, and after the method 600, and some operations described can be replaced, eliminated, or moved around for additional embodiments of method 600. Method 600 will be described in more detail below.

Method 600 includes a block 602 where locations of a UBM feature and a corresponding PIO of the UBM feature in a die of a semiconductor device is determined. In some embodiments, the size the PIO, e.g., under the UBM feature, is also determined. The die includes a substrate and an interconnect structure over the substrate. Referring back to FIGS. 2A, 3A, and 4A, the location of a UBM feature (e.g., 206, 306, or 406) may be determined prior to the fabrication of the semiconductor device (e.g., an IC chip). The semiconductor device may be an example of semiconductor device 200, 300, or 400. The die may include a substrate (e.g., 218, 318, or 418) and an interconnect structure (e.g., 216, 316, or 416) over the substrate.

Method 600 includes a block 604 where a location of a stacked via structure in the interconnect structure is determined based on a stress profile of the interconnect structure under the UBM feature. In some embodiments, the stress in the interconnect structure under the UBM feature may be equal to or higher than a threshold value. Referring back to FIGS. 2A, 3A, 4A, and 1A-1D, prior to the fabrication of the semiconductor device, if the stress in the interconnect structure (e.g., 216, 316, or 416) under the UBM feature is determined to be equal to or higher than a predetermined threshold value, the location of a stacked via structure (e.g., 222, 322, or 422) in the interconnect structure may be determined. In some embodiments, simulation may be performed to compute/predict the stress distribution in the interconnect structure, referring back to FIGS. 1A-1D. For example, a KOZ (e.g., 224) may be determined in the interconnect structure based on the stress profile. The projection of the KOZ may substantially cover the part (e.g., "ELK stress hot zone" in FIGS. 1B-1D) of the interconnect structure undergoing the highest stress in a thermal cycling. The projection of the KOZ may be completely within the area defined by a PIO of the UBM feature. Depending on the location of the UBM feature, the center of the KOZ may be substantially located at the geographic center of the die, or along a line through the center of the respective PIO and the geographic center of the die. The stacked via structure (e.g., 222) may be determined to be formed outside the KOZ. In some embodiments, a first photomask may be accordingly designed for forming the stacked via structure outside the KOZ. In another example, no KOZ is determined, and the stacked via structure (e.g., 322 or 422) may be formed under the respective UBM feature. In some embodiments, a second photomask may be accordingly designed for forming the stacked via structure away from another contact via (e.g., 311) directly above or below the stacked via structure.

Method 600 includes a block 606 where the stacked via structure is formed in the interconnect structure. In some embodiments, after the location of the stacked via structure is determined, the fabrication to form the semiconductor device may begin. In some embodiments, a plurality of IMD layers are formed over the substrate, and a plurality of metallization layers can be formed in the IMD layers. The IMD layers may be formed by a suitable deposition method such as physical vapor deposition (PVD), chemical vapor deposition (CVD), and/or atomic layer deposition (ALD). The IMD layers may include one or more ELK materials. The metallization layers may be formed by PVD, CVD, ALD, electroplating, and/or electroless plating. The interconnect structure (e.g., 216, 316, or 416) may be formed.

In some embodiments, a KOZ is determined, and a stacked via structure (e.g., 222 in FIG. 2A) is formed laterally located outside the KOZ. As stated above, stacked via structures formed outside the KOZ (e.g., the "ELK stress hot zone") is less susceptible to defects caused by high stress, these stacked via structures (e.g., 220 in FIG. 2A) can include at least two, even more than three contact vias stacked and aligned vertically. In some embodiments, the stacked via structure includes at least four contact vias. The formation of the stacked via structure may include using the first photomask for forming the stacked via structure outside the KOZ but in the area defined by the PIO. In some embodiments, the formation of the stacked via structure includes a photolithography process, an etching (e.g., dry etch and/or wet etch) process, and a deposition process.

In some embodiments, no KOZ is determined in the interconnect structure, and the interconnect structure includes a stacked via structure (e.g., 322 in FIG. 3A or 422 in FIG. 4A) of which the projection is located in the area the UBM feature (or the PIO) is to be formed. The stacked via structure may include no more than three consecutively stacked contact vias (e.g., 220 in FIG. 2A) vertically aligned with one another. For example, the stacked via structure may include two or three consecutive stacked contact vias. In some embodiments, a stress profile of the interconnect structure under the UBM feature is used to determine the number (e.g., two or three) of stacked contact vias in the stacked via structure. For example, a stacked via structure with two consecutive stacked contact vias is formed in the area with a higher stress, and a stacked via structure with three consecutive stacked contact vias is formed in the area with a lower stress. The formation of the stacked via structure may include using the second photomask for the formation of an adjacent contact via (e.g., 311 in FIG. 3A) immediately above and/or below the stacked via structure (e.g., 322 in FIG. 3A or 422 in FIG. 4A). The adjacent contact via may be formed at least 26.5 nm away (e.g., in the x-y plane) from the stacked via structure. In some embodiments, the formation of the stacked via structure includes a photolithography process, an etching (e.g., dry etch and/or wet etch) process, and a deposition process.

Method 600 includes a block 608 where the PIO is formed over the interconnect structure. Referring back to FIGS. 2A, 3A, and 4A, one or more passivation layers (e.g., 210, 212, 310, 312, 410, or 412) may be formed over the interconnect structure. A contact pad (e.g., 232, 332, or 432) may be formed over the interconnect structure. The contact pad may be electrically coupled to the interconnect structure, and may be insulated by the one or more passivation layers. A polyimide (PI) layer (e.g., 208, 308, or 408) may be formed over the contact pad. The PI layer may include a PI opening (PIO, 226, 326, or 426) exposing part of the contact pad. In some embodiments, the vertical projection of the PIO may be concentric with the vertical projection of the subsequently-formed UBM feature. The formation of the passivation layer(s) may include PVD, CVD, and/or ALD. The formation of the PI layer may include condensation polymerization. The formation of the PIO may include a photolithography process and an etching process. The formation of the contact pad may include PVD, CVD, ALD, electroplating, and/or electroless plating.

Method 600 includes a block 610 where the UBM feature is formed over the PIO. Referring back to FIGS. 2A, 3A, and 4A, a UBM feature (e.g., 206, 306, or 406) may be formed over the PIO. The UBM feature may be electrically coupled to the underlying contact pad (e.g., 232, 332, or 432). The formation of the UBM feature may include PVD, CVD, ALD, electroplating, and/or electroless plating. In some embodiments, a solder feature (e.g., 204, 304, or 404) is formed over the UBM feature by soldering.

In one embodiment, the present disclosure provides a method. The method includes determining a location of a PIO corresponding to a UBM feature in a die. The die includes a substrate and an interconnect structure over the substrate. The method also includes determining a location of a stacked via structure in the interconnect structure based on the location of the PIO. The method further includes forming, in the interconnect structure, the stacked via structure having at most three stacked contact vias at the location of the PIO. In some embodiments, the at most three contact vias are vertically aligned with and electrically coupled to one another in an area disposed below the PIO. In some embodiment, a topmost one of the at most three stacked contact vias is below a top contact via of the interconnect structure. In some embodiments, the forming of the stacked via structure further includes forming the stacked via structure laterally away from the top contact via in the interconnect structure by a lateral distance, the lateral distance being at least about 26.5 nm. In some embodiments, the forming of the stacked via structure in the interconnect structure includes forming at most two contact vias vertically aligned with and electrically connected to one another in the area disposed below the PIO. A topmost one of the at most two contact vias is a top contact via of the interconnect structure.

In some embodiments, the method further includes forming the PIO over the stacked via structure, and forming the UBM feature over the PIO. In some embodiments, a vertical projection of the stacked via structure is completely within a vertical projection of the PIO. In some embodiments, the vertical projection of the stacked via structure is substantially concentric with the vertical projection of the PIO. In some embodiments, the forming of the interconnect structure comprises depositing a plurality of ELK dielectric layers and forming a plurality of interconnect layers in the ELK dielectric layers, and the forming of the stacked via structure includes forming a plurality of contact vias vertically aligned with one another in the interconnect structure. Each of the contact vias is in a respective one of the ELK dielectric layers.

In another embodiment of the present disclosure, a semiconductor device includes an interconnect structure. The interconnect structure includes a plurality of ELK dielectric layers over a substrate in a die, and a first stacked via structure in the ELK dielectric layers. The first stacked via structure includes at least three first contact vias vertically aligned with one another. Each of the at least three first contact vias is in a respective one of the ELK dielectric layers. The interconnect structure also includes a second stacked via structure in the ELK dielectric layers. The second stacked via structure includes at least three second contact vias vertically aligned with one another. Each of the at least three second contact vias is in a respective one of the ELK dielectric layers. The interconnect structure also includes a first PIO of a PI layer over the plurality of ELK dielectric layers. The first PIO is at a geographic center of the die and over the interconnect structure. A vertical projection of the first stacked via structure is outside a first circular zone substantially concentric with the first PIO. The interconnect structure further includes a second PIO of the PI layer over the plurality of ELK dielectric layers. The second PIO is at one of an edge or one of a corner of the die and over the interconnect structure. A vertical projection of the second stacked via structure is outside a second circular zone having a center on a line through a center of the second PIO and the geographic center of the die. The semiconductor device also includes a UBM feature over each of the first PIO and the second PIO.

In some embodiments, the first circular zone is completely within a boundary of the first PIO. In some embodiments, the second circular zone is completely within a boundary of the second PIO. In some embodiments, a ratio of a distance between the center of the second circular zone and the center of the second PIO to a diameter of the second PIO is in a range from about 0 to about 0.15. In some embodiments, the first circular zone and the second circular zone each has a circular shape. In some embodiments, a ratio of a diameter of each of the first circular zone and the second circular zone to a diameter of the respective PIO is in a range from about 0.4 to about 0.6. In some embodiments, a topmost one of the at least three stacked contact vias is a top contact via of the interconnect structure.

In yet another embodiment of the present disclosure, a semiconductor device includes an interconnect structure. The interconnect structure includes a plurality of ELK dielectric layers stacked over a substrate in a die, and a stacked via structure in the ELK dielectric layers. The stacked via structure includes at most three contact vias vertically aligned with one another vertically. Each of the at most three contact vias is in a respective one of the ELK dielectric layers. The interconnect structure also includes a PIO of a PI layer over the plurality of ELK dielectric layers. The semiconductor device also includes a UBM feature over the interconnect structure. The stacked via structure is located under the PIO. In some embodiments, a vertical projection of the stacked via structure is completely within a vertical projection of the PIO. In some embodiments, a topmost one of the at most three contact vias is below a top contact via of the interconnect structure, and a lateral distance between the top contact via of the interconnect structure and the stacked via structure is at least about 26.5 nm. In some embodiments, a topmost one of the at most three contact vias is a top contact via of the interconnect structure, and a number of the at most three contact vias is equal to or less than 2.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
an interconnect structure comprising:
a plurality of extreme low-k (ELK) dielectric layers over a substrate in a die;
a first stacked via structure in the ELK dielectric layers, the first stacked via structure comprising at least three first contact vias vertically aligned with one another, each of the at least three first contact vias being in a respective one of the ELK dielectric layers; and
a second stacked via structure in the ELK dielectric layers, the second stacked via structure comprising at least three second contact vias vertically aligned with one another, each of the at least three second contact vias being in a respective one of the ELK dielectric layers;
a first polyimide (PI) opening (PIO) of a PI layer over the plurality of ELK dielectric layers, the first PIO being at a geographic center of the die and over the interconnect structure, wherein a vertical projection of the first stacked via structure is outside a first circular zone substantially concentric with the first PIO;
a second PIO of the PI layer over the plurality of ELK dielectric layers, the second PIO being at one of an edge or one of a corner of the die and over the interconnect structure, wherein a vertical projection of the second stacked via structure is outside a second circular zone having a center on a line through a center of the second PIO and the geographic center of the die; and
an under-bump metallization (UBM) feature over each of the first PIO and the second PIO.

2. The semiconductor device of claim 1, wherein the first circular zone is completely within a boundary of the first PIO.

3. The semiconductor device of claim 1, wherein the second circular zone is completely within a boundary of the second PIO.

4. The semiconductor device of claim 1, wherein a ratio of a distance between the center of the second circular zone and the center of the second PIO to a diameter of the second PIO is in a range from about 0 to about 0.15.

5. The semiconductor device of claim 1, wherein the first circular zone and the second circular zone each have a circular shape.

6. The semiconductor device of claim 1, wherein a ratio of a diameter of each of the first circular zone and the second circular zone to a diameter of the respective PIO is in a range from about 0.4 to about 0.6.

7. The semiconductor device of claim 1, wherein a topmost one of the first contact vias in the first stacked via structure is a top contact via of the interconnect structure.

8. A semiconductor device, comprising:
an interconnect structure comprising:
a plurality of extreme low-k (ELK) dielectric layers stacked over a substrate in a die; and
a stacked via structure in the ELK dielectric layers, the stacked via structure comprising a plurality of contact vias vertically aligned with one another, each of the contact vias being in a respective one of the ELK dielectric layers;
a polyimide (PI) opening (PIO) of a PI layer over the plurality of ELK dielectric layers, wherein a vertical projection of the stacked via structure is inside the PIO but outside a circular zone substantially concentric with the PIO in a top view of the die; and
an under-bump metallization (UBM) feature over the interconnect structure, wherein the stacked via structure is located under the PIO.

9. The semiconductor device of claim 8,
wherein a topmost one of the contact vias is below a top contact via of the interconnect structure; and
wherein a lateral distance between the top contact via of the interconnect structure and the stacked via structure is at least about 26.5 nm.

10. The semiconductor device of claim 8,
wherein a topmost one of the contact vias is a top contact via of the interconnect structure; and
wherein a number of the contact vias is equal to or less than 2.

11. The semiconductor device of claim 8, further comprising a contact pad overlaying the stacked via structure, the contact pad extending laterally over an edge of the PIO.

12. The semiconductor device of claim 8, wherein the interconnect structure further comprises a first contact via below the stacked via structure; and wherein the first contact via is laterally offset from the stacked via structure.

13. A semiconductor device, comprising:

a die comprising an interconnect structure disposed over a substrate, the interconnect structure comprising:

a stack of low-k dielectric layers; and a via structure disposed in the stack, the via structure comprising a plurality of contact vias vertically aligned with one another, and each of the contact vias being disposed in a respective one of the low-k dielectric layers in the stack; and a polyimide (PI) layer disposed over the interconnect structure, wherein the PI layer has an opening (PIO) vertically aligned with a geometric center of the die, wherein the via structure is located directly under the PIO, and wherein a vertical projection of the via structure is inside the PIO but outside a circular zone substantially concentric with the PIO in a top view of the die; and an under-bump metallization (UBM) feature disposed over the interconnect structure.

14. The semiconductor device of claim 13, wherein a number of the contact vias in the via structure is at most three.

15. The semiconductor device of claim 13, wherein the interconnect structure further comprises a top contact via above the via structure; and wherein the top contact via is laterally offset from a topmost one of the contact vias in the via structure.

16. The semiconductor device of claim 15, wherein the interconnect structure further comprises a bottom contact via below the via structure; and wherein the bottom contact via is laterally offset from a bottommost one of the contact vias in the via structure.

17. The semiconductor device of claim 13, further comprising a contact pad, wherein the UBM feature extends into the PIO to contact the contact pad.

18. The semiconductor device of claim 17, wherein the contact pad extends laterally beyond an edge of the PIO.

19. The semiconductor device of claim 8, wherein the stacked via structure is a first stacked via structure and the PIO is a first PIO, wherein the semiconductor device further comprises a second PIO in the PI layer and a second stacked via structure in the ELK dielectric layers, wherein the second stacked via structure comprising a plurality of contact vias, and wherein a vertical projection of the second stacked via structure is inside the second PIO but outside a circular zone having a center on a line through a center of the second PIO and a geographic center of the die.

20. The semiconductor device of claim 8, wherein a ratio of a diameter of the circular zone to a diameter of the PIO is between 0.4 and 0.6.

* * * * *